United States Patent
Mentze et al.

(10) Patent No.: US 7,061,298 B2
(45) Date of Patent: Jun. 13, 2006

(54) HIGH VOLTAGE TO LOW VOLTAGE LEVEL SHIFTER

(75) Inventors: Erik J. Mentze, Moscow, ID (US); Herbert L. Hess, Moscow, ID (US); Kevin M. Buck, Pullman, WA (US); David F. Cox, Tucson, AZ (US)

(73) Assignee: Idaho Research Foundation, Inc., Moscoe, ID (US)

( * ) Notice: Subject to any disclaimer, the term of this patent is extended or adjusted under 35 U.S.C. 154(b) by 56 days.

(21) Appl. No.: 10/920,632

(22) Filed: Aug. 18, 2004

(65) Prior Publication Data

US 2005/0040853 A1   Feb. 24, 2005

Related U.S. Application Data

(60) Provisional application No. 60/498,862, filed on Aug. 22, 2003.

(51) Int. Cl.
*H03L 5/00*   (2006.01)
(52) U.S. Cl. ............................. 327/333; 326/68; 326/81
(58) Field of Classification Search ................. 326/68, 326/81; 327/333
See application file for complete search history.

(56) References Cited

U.S. PATENT DOCUMENTS

| | | | | |
|---|---|---|---|---|
| 629,800 A | * | 8/1899 | Kitade et al. | 400/24 |
| 5,046,048 A | * | 9/1991 | Atsumi et al. | 365/201 |
| 6,307,421 B1 | * | 10/2001 | Kawano et al. | 327/398 |
| 6,388,470 B1 | * | 5/2002 | Mattos et al. | 326/81 |
| 6,411,554 B1 | * | 6/2002 | Kawai | 365/189.09 |
| 6,445,240 B1 | * | 9/2002 | Taheri | 327/333 |
| 6,493,414 B1 | * | 12/2002 | Callahan | 377/69 |

* cited by examiner

*Primary Examiner*—Long Nguyen
*Assistant Examiner*—Ryan Jager
(74) *Attorney, Agent, or Firm*—Lee & Hayes, PLLC

(57) ABSTRACT

A shifter circuit comprises, in one embodiment, an input voltage divider stage comprising multiple transistors arranged in a transistor stack defining a plurality of intermediate nodes. The transistor stack is connected between an input signal and ground and has at least one output. An inverting buffer stage is connected to a supply voltage and coupled to the input voltage divider's output. The inverting buffer stage is configured to provide an inverted output signal. Means are provided for stepping up the inverted output signal, receiving a stepped up output signal and providing a level-shifted output signal at a voltage level lower than that of the input signal.

18 Claims, 4 Drawing Sheets

HIGH VOLTAGE TO LOW VOLTAGE LEVEL SHIFTER

RELATED APPLICATION

This application claims priority to U.S. Provisional Application Ser. No. 60/498,862, filed Aug. 22, 2003, the disclosure of which is incorporated by reference herein.

TECHNICAL FIELD

This invention relates to voltage level shifters and more particularly, to level shifters that shift from high voltages to lower voltages.

BACKGROUND

Historically, the primary mode of reducing power consumption in electronic circuits has been to aggressively scale down the power supply voltage. This power supply reduction follows naturally for CMOS technologies since the Moore's Law scaling of processes into the nanometer range has resulted in gate oxide breakdown voltages on the order of 3.3 volts, 2.5 volts, 1.8 volts and lower. While effective in mitigating power consumption, this reduced breakdown voltage places significant limitations on the interconnection of these devices with other higher voltage systems. Such high voltage systems include 5 volt Legacy hardware and 28 volt aerospace hardware.

A typical solution to this problem is to add intermediate control circuitry between the integrated circuit and the external high voltage system. In this manner the system logic is performed at efficient low voltage levels, while the output is driven from an external source. This solution is viable, however the size and complexity of the overall design is increased considerably. A second typical solution is to use an integrated circuit process that is capable of laying down thick as well as thin gate oxides. This enables low voltage as well as high voltage transistors to be laid down on the same substrate. However, this alteration of the original fabrication process is prohibitively expensive in many applications. Further both of these solutions suffer from another problem—something external to the desired integrated circuit fabrication process must be added to the final design. In extreme environment applications (i.e. high temperature, low temperature, high radiation, high pressure, corrosive, etc.) this is not always acceptable. The integrated circuit fabrication process has been chosen for its temperature, radiation, and pressure characteristics. By adding external devices or altering the fabrication process these required characteristics can be lost.

This invention arose out of a need to develop a high voltage to low voltage logic level shifters that can be fully integrated onto the same substrate as the low voltage logic circuitry that controls it. That is, without altering the fabrication process in any way, this invention creates a means by which to control high voltage signals that exceed the breakdown voltage of the process used for fabrication.

SUMMARY

A shifter circuit comprises, in one embodiment, an input voltage divider stage comprising multiple transistors arranged in a transistor stack defining a plurality of intermediate nodes. The transistor stack is connected between an input signal and ground and has at least one output. An inverting buffer stage is connected to a supply voltage and coupled to the input voltage divider's output. The inverting buffer stage is configured to provide an inverted output signal. Means are provided for stepping up the current drive capability of the inverted output signal, receiving the stepped up output signal and providing a level-shifted output signal at a voltage level lower than that of the input signal.

DETAILED DESCRIPTION

Overview

Figure 1:
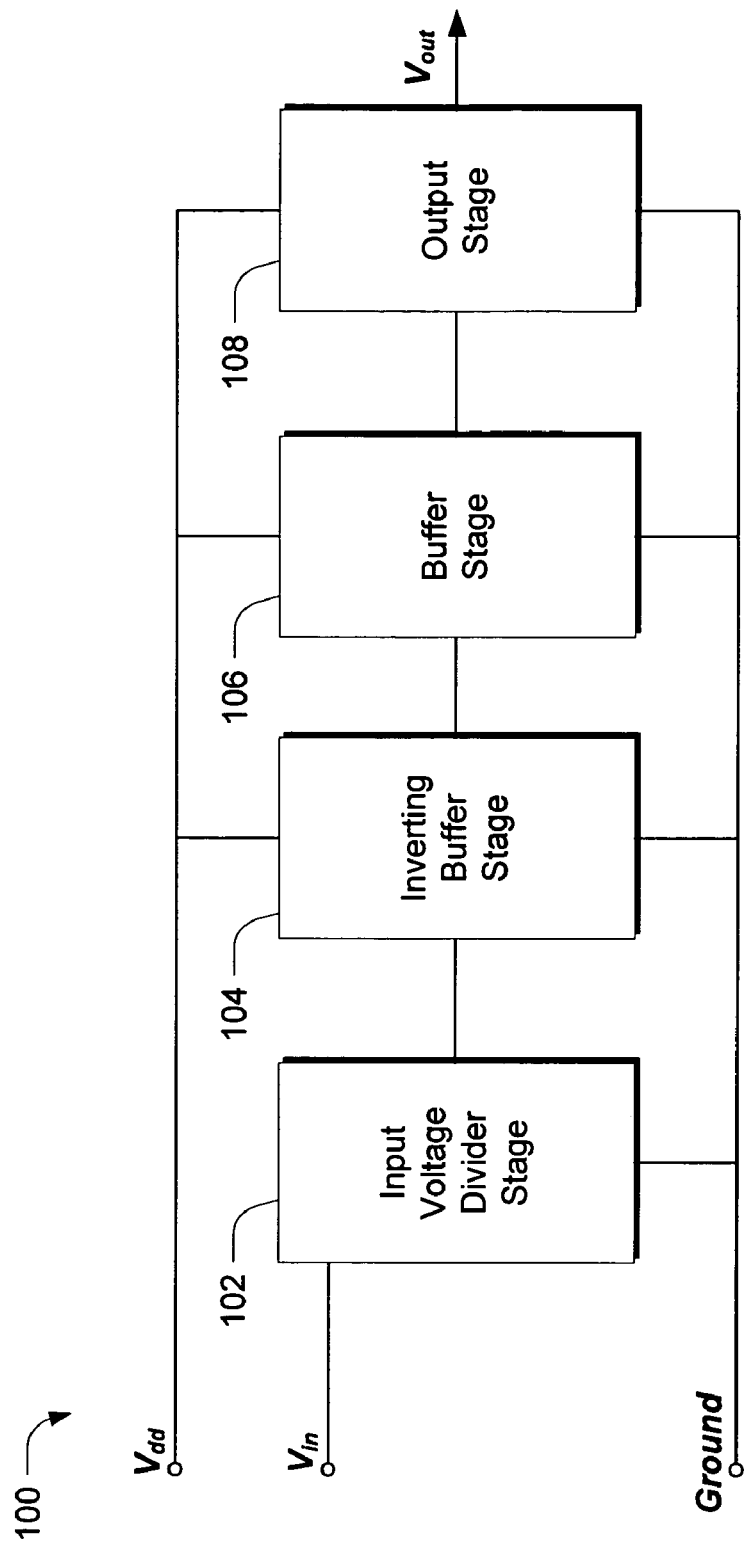
FIG. 1 is a block diagram of an exemplary circuit in accordance with one embodiment.

FIG. 1 shows an exemplary circuit diagram of a high voltage to low voltage level shifter circuit in accordance with one embodiment generally at 100. The illustrated circuit comprises an input voltage divider stage 102, an inverting buffer stage 104, a buffer stage 106 and an output stage 108.

The level shifter circuit described below is particularly well-suited for use in connection with low voltage, deep sub-micron processes, e.g. SOI processes. It is to be appreciated and understood, however, that the described circuit is not limited to SOI contexts. Rather, other types of fabrication processes can be utilized to implement the illustrated circuit, e.g. bulk processes, non silicon processes, and others, as will be appreciated by the skilled artisan. In the SOI context, however, the design about to be described takes advantage of SOI properties, as will become apparent below.

It is to be appreciated and understood that the described circuit is not limited to any one particular high voltage level or to any one particular low voltage level. Rather, the circuit can be configured and scaled to arbitrarily high levels and arbitrarily low levels.

In this embodiment, an input logic signal $V_{in}$ drives input voltage divider stage 102 and the voltage divider stage is tied between $V_{in}$ and ground. The inverting buffer stage 104 taps the input voltage divider from one or more points to generate the low voltage level at its output. Advantageously, in the SOI embodiment, this stage takes advantage of the low capacitances of SOI transistors, as will be appreciated by the skilled artisan. The buffer stage 106 steps up the current capability of inverting buffer stage 104, while maintaining its voltage level, to better drive a large output stage.

Exemplary Circuit

Figure 2:
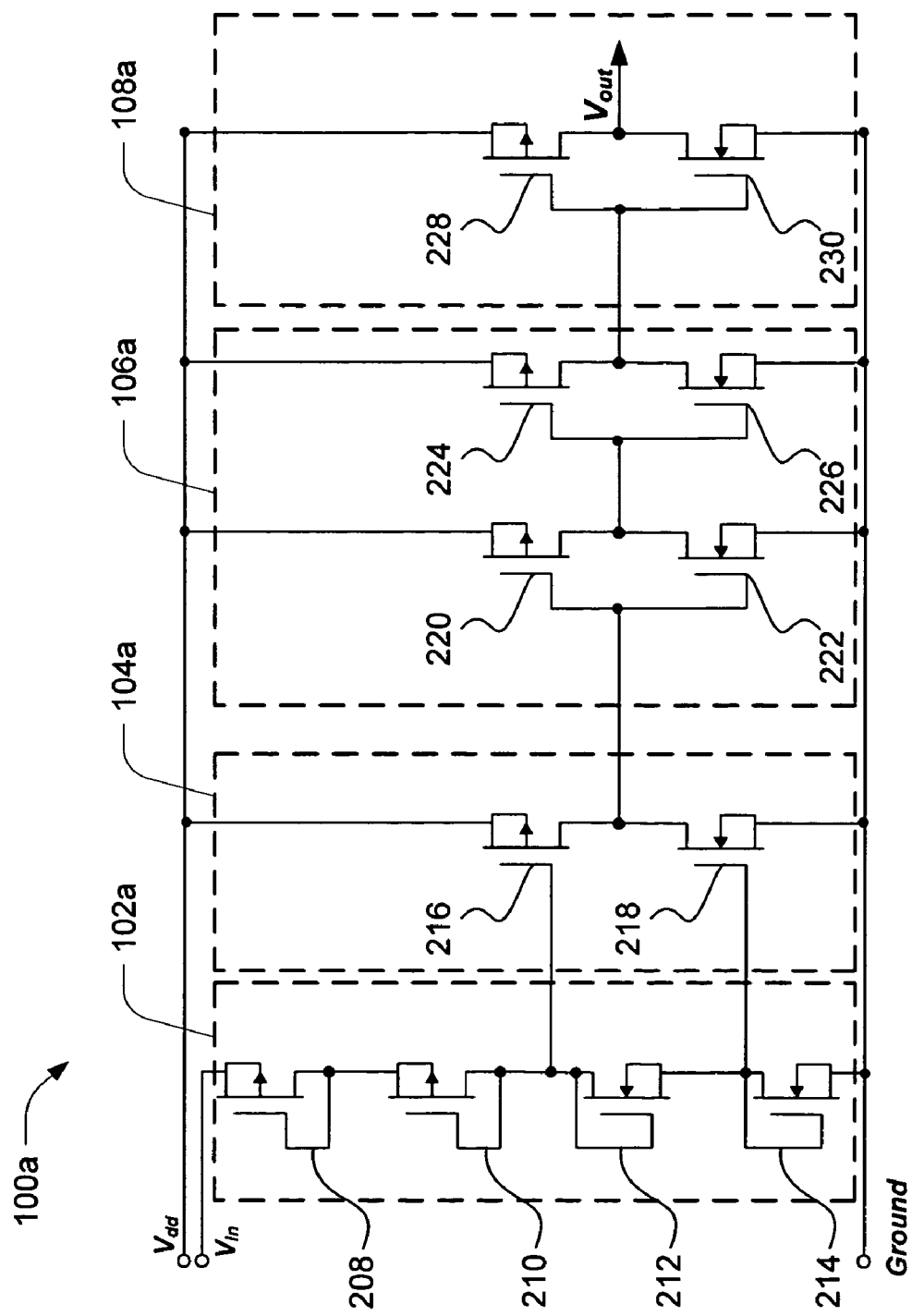
FIG. 2 is a schematic diagram of an exemplary circuit in accordance with one embodiment.

FIG. 2 shows an exemplary high voltage to low voltage level shifter circuit in accordance with one embodiment, generally at 100a. Like numerals from the FIG. 1 example have been used where appropriate, with differences being indicated with the suffix "a". Accordingly, circuit 100a comprises an input voltage divider stage 102a, an inverting buffer stage 104a, a buffer stage 106a and an output stage 108a.

Input voltage divider stage 102a comprises, in this example, transistors in the form of MOSFETs 208, 210, 212 and 214. In this particular example, each transistor has its source tied to the bulk contact. This is because the circuit is implemented using an SOI process. As noted above, however, such need not necessarily be the case. Hence, in other implementations, the source/bulk connection need not be made.

In this particular implementation, transistors 208 and 210 are p-channel devices and have their gates tied to their respective drains. Similarly, transistors 212 and 214 are n-channel devices and have their gates tied to their respective drains. Such arrangement, as will be appreciated by the skilled artisan, constitutes a diode connection. Transistors 208, 210, 212 and 214 constitute a transistor stack having intermediate nodes interconnecting the transistors, as will become apparent.

Transistor 208 is connected by its drain to the source of transistor 210. The connection between these transistors constitutes an intermediate node. Transistor 210 has its drain connected to the drain of transistor 212 which constitutes another intermediate node. Transistor 212 has its source connected to the drain of transistor 214 which, in turn, constitutes another intermediate node. The source of transistor 208 is tied to $V_{in}$, which is the input signal that is being level shifted. The source of transistor 214 is tied to ground.

Each of the inverting buffer stage 104a, buffer stage 106a and output stage 108a is connected between $V_{dd}$ (the level being shifted to) and ground. In this embodiment, the output of the input voltage divider stage 102a is taken from two intermediate nodes. A first output is taken from the node connecting the drains of transistors 210 and 212, and is used to drive the gate of transistor 216 (a p-channel device) in the inverting buffer stage 104a. A second output is taken from the node connecting the source of transistor 212 and the drain of transistor 214, and is used to drive the gate of transistor 218 (an n-channel device) in the inverting buffer stage 104a.

The output of the inverting buffer stage 104a is taken from the node that ties together the drains of transistors 216 and 218 and is used to drive the gates of transistor 220 (a p-channel device) and transistor 222 (an n-channel device) in the buffer stage 106a. The drains of transistors 220 and 222 are tied together to define a node that drives the gates of transistor 224 (a p-channel device) and transistor 226 (an n-channel device) in buffer stage 106a.

The output of buffer stage 106a is taken from the node that ties the drains of transistors 224 and 226 together and is used to drive the gates of transistor 228 (a p-channel device) and transistor 230 (an n-channel device) in output stage 108a.

The output $V_{out}$ of output stage 108a is taken from the node that ties together the drains of transistors 228 and 230.

In Operation

The primary level shifting function, in accordance with the FIG. 2 embodiment, is performed by input voltage divider stage 102a and inverting buffer stage 104a. Input voltage divider stage 102a is configured, in this embodiment, as a diode stack that has been sized to cause the appropriate voltage drop across each device. It is extended or shortened depending on the required input level. Inverting buffer stage 104a, as noted above, is an inverting buffer that is driven by two points on the diode stack.

Figure 3:
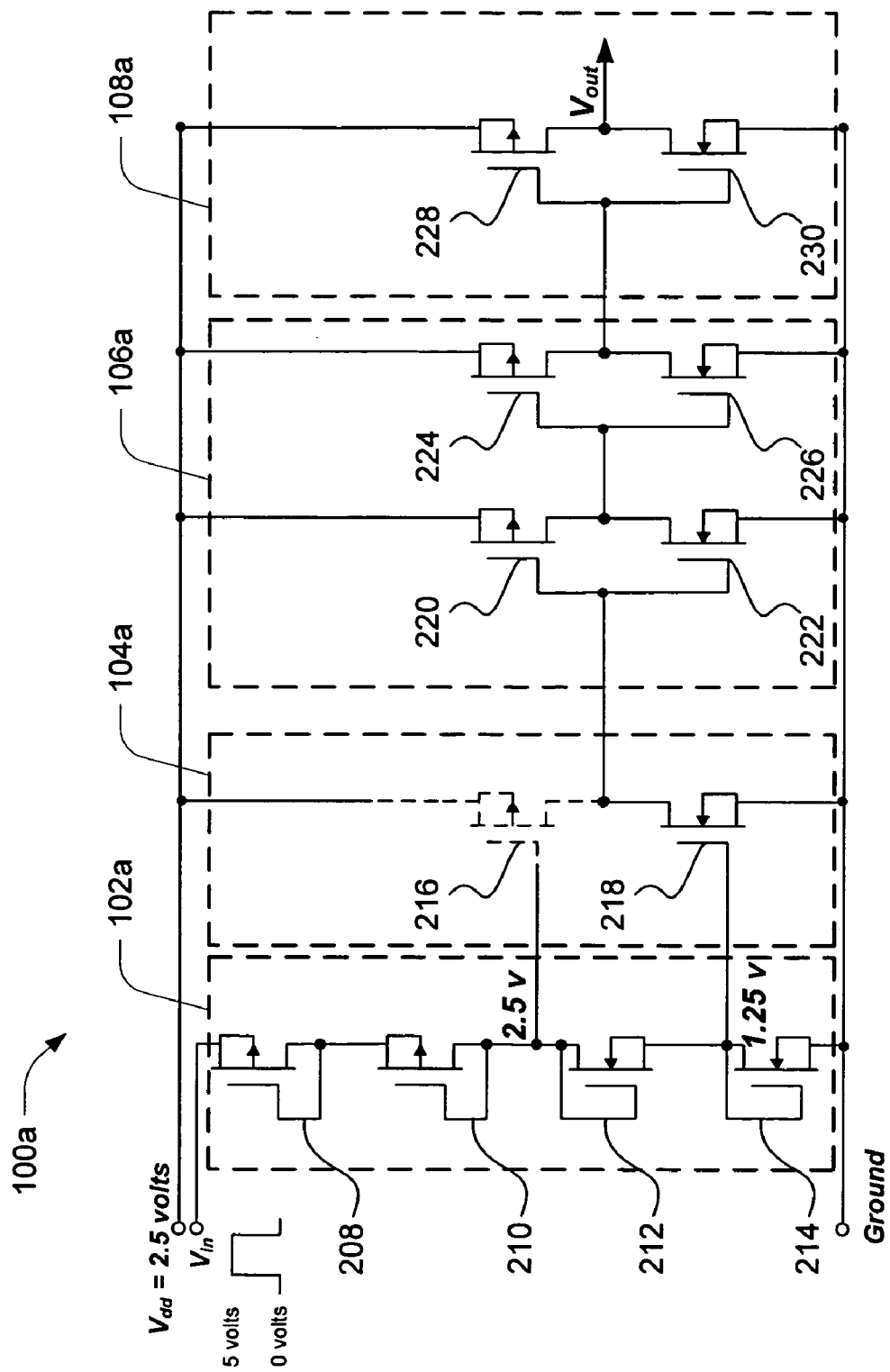
FIG. 3 is a schematic diagram of an exemplary circuit in accordance with one embodiment.

As an example of how this circuit can be employed, consider FIG. 3 and assume that the circuit is being used to shift down from 5 volts to 2.5 volts. Here, $V_{dd}$ is the supply voltage for the circuit and is the voltage level to which the circuit is shifting—in this example 2.5 volts. $V_{in}$ is the input voltage and is pulsing between 0 and 5 volts. When $V_{in}$ is at 5 volts, the input voltage divider stack is sized to divide the signal down to 2.5 volts on the node connecting the drains of transistors 210 and 212. Accordingly, the voltage at the node just below (i.e. the node connecting the source of transistor 212 and the drain of transistor 214) is 1.25 volts. The 2.5 volts that drives the gate of transistor 216 turns that transistor off (indicated by the dashed transistor), while the 1.25 volts that drives the gate of transistor 218 turns that transistor on. When this happens, there is a 0 volt signal at the common drain point between transistors 216, 218.

Figure 4:
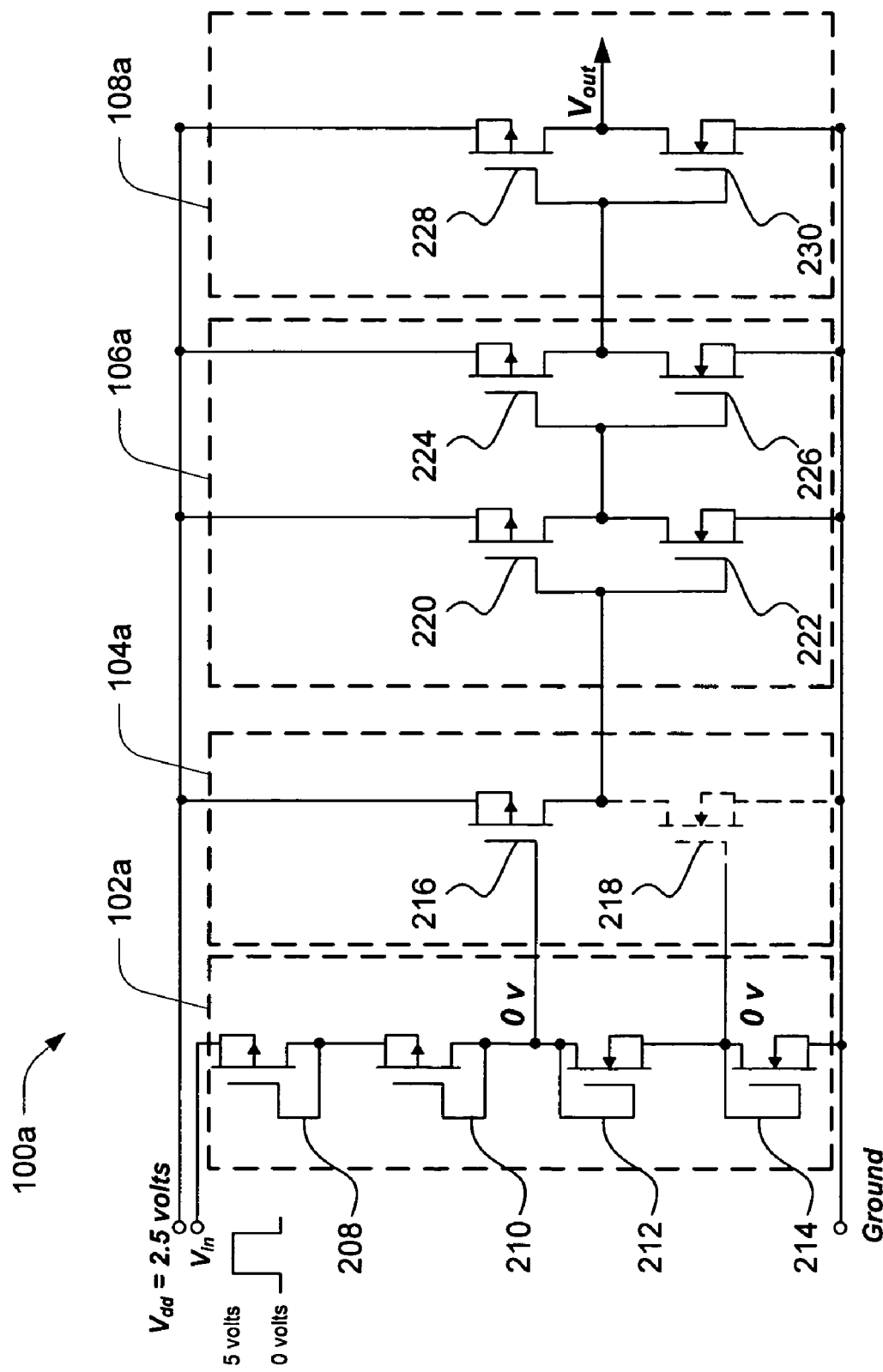
FIG. 4 is a schematic diagram of an exemplary circuit in accordance with one embodiment.

When the $V_{in}$ falls from 5 volts to 0 volts, there will be 0 volts across the input voltage divider stage 102a. This causes all of the intermediate nodes in that stage to fall to 0 volts. When this happens, as shown in FIG. 4, transistor 218 is turned off and transistor 216 is turned on. This, in turn, causes the voltage at the common drain between transistors 216, 218 to rise to 2.5 volts.

The buffer stage 106a then steps up the current capability of inverting buffer stage 104a, while maintaining its voltage level, to better drive a large output stage, such as output stage 108a, as will be appreciated by the skilled artisan.

By driving inverting buffer stage 104a by two points rather than one, difficulties created by small process deviations that can cause malfunction and device failure in low breakdown processes can be mitigated. Also, this allows for greater deviation from the nominal input signal level, while still maintaining the appropriate output level.

As will be appreciated by the skilled artisan, one challenge in using a large diode stack for level shifting is that the diode stack has a significant output resistance that is in parallel with the gate capacitance of any following stage. This resistance/capacitance parallel combination creates an RC decay effect when the device switches from a high state to a low state. Since the output resistance is a fixed value, the gate capacitance of the inverting buffer stage should be minimized. Accordingly, using an SOI process, which has inherently lower gate capacitances, constitutes a very desirable design feature.

Additionally, very small or minimum geometry transistors can be utilized to reduce gate capacitance to the extent possible. The advantages gained by this design are higher frequencies of operation, quicker overall system response, and greater scalability to higher input voltages. For example, in one implementation, the circuit was used, with a larger transistor stack in the input voltage divider stage 102a, in connection with an application that shifted from 28 volts to 2.5 volts.

In Use

Uses of the above-described circuit include, by way of example and not limitation the following: providing an interface between low voltage integrated circuit technologies and other integrated circuit technologies that operate at higher logic levels, control of electromechanical actuators, control of gas and liquid apertures, control of high pressure propellant apertures, MEMS device control, system-on-chip power management, and power converter feedback control loops. Further, various embodiments find wide use in extreme environment applications, where the processes used for fabrication of the integrated circuits are chosen specifically for there tolerance to environmental variables, not breakdown voltage. As stated previously, the levels used here are not fixed, but can vary as application is needed.

Although the invention has been described in language specific to structural features and/or methodological steps, it is to be understood that the invention defined in the appended claims is not necessarily limited to the specific features or steps described. Rather, the specific features and steps are disclosed as preferred forms of implementing the claimed invention.

The invention claimed is:

1. A shifter circuit comprising:
   an input voltage divider stage comprising multiple transistors arranged in a transistor stack defining a plurality of intermediate nodes, the transistor stack being connected between an input signal and ground, and having at least one output;
   an inverting buffer stage connected to a supply voltage and coupled to the input voltage divider's output, the inverting buffer stage being configured to provide an inverted output signal;
   means for stepping up the inverted output signal; and
   means for receiving a stepped up output signal and providing a level-shifted output signal at a voltage level lower than that of the input signal, wherein said input voltage divider stage has two outputs, and wherein the inverting buffer stage comprises a first transistor having a gate driven by a first of the outputs, and a second transistor having a gate driven by a second of the outputs.

2. The shifter circuit of claim 1, wherein said transistor stack comprises p-channel devices and n-channel devices.

3. The shifter circuit of claim 1, wherein said transistor stack comprises p-channel devices and n-channel devices, and wherein one of the p-channel devices is connected to the input signal.

4. The shifter circuit of claim 1, said transistor stack comprises p-channel devices and n-channel devices, each of which has its associated gate tied to its drain.

5. The shifter circuit of claim 1, wherein said first transistor comprises a p-channel device.

6. The shifter circuit of claim 1, wherein said second transistor comprises an n-channel device.

7. The shifter circuit of claim 1, wherein said first transistor comprises a p-channel device, and said second transistor comprises an n-channel device.

8. The shifter circuit of claim 7, wherein said transistor stack comprises p-channel devices and n-channel devices, and wherein one of the p-channel devices is connected to the input signal.

9. The shifter circuit of claim 8, wherein the first of the input voltage divider stage's outputs is taken from an intermediate node between a p-channel and an n-channel device, and wherein the second of the input voltage divider stage's outputs is taken from an intermediate node between a pair of n-channel devices.

10. The shifter circuit of claim 1, wherein said transistors comprise MOSFETs each of which being source/bulk connected.

11. A shifter circuit comprising:
    an input voltage divider stage comprising multiple transistors arranged in a transistor stack defining a plurality of intermediate nodes, the transistor stack being connected between an input signal and ground, the input voltage divider having a pair of outputs each of which at a different intermediate node, the transistor stack comprising:
    multiple p-channel MOSFETs each of which being gate/drain connected; and
    multiple n-channel MOSFETs each of which being gate/drain connected;
    wherein said input signal is connected to a source of one of the p-channel MOSFETs;
    an inverting buffer stage configured to produce an inverted output signal, the inverting buffer stage being connected to a supply voltage and comprising a p-channel MOSFET and an n-channel MOSFET, wherein the inverting buffer stage's p-channel MOSFET is driven by an intermediate node between a p-channel MOSFET and an n-channel MOSFET of the input voltage divider stage, and the inverting buffer stage's n-channel MOSFET is driven by an intermediate node between two n-channel MOSFETs of the input voltage divider stage;
    means for stepping up the inverted output signal; and
    means for receiving a stepped up output signal and providing a level-shifted output signal at a voltage level lower than that of the input signal.

12. The shifter circuit of claim 11, wherein each MOSFET is source/bulk connected.

13. A method comprising:
    supplying a voltage level down to which a shift is desired;
    supplying an input signal that is to be level-shifted downward; and
    shifting the input signal downward, using a circuit comprising:
    an input voltage divider stage comprising multiple transistors arranged in a transistor stack defining a plurality of intermediate nodes, the transistor stack being connected between the input signal and ground, and having at least one output;
    an inverting buffer stage connected to a said voltage level and coupled to the input voltage divider's output, the inverting buffer stage being configured to provide an inverted output signal;
    means for stepping up the inverted output signal; and
    means for receiving a stepped up output signal and providing a level-shifted output signal at a voltage level lower than that of the input signal, wherein said input voltage divider stage has two outputs, and wherein the inverting buffer stage comprises a first transistor having a gate driven by a first of the outputs, and a second transistor having a gate driven by a second of the outputs.

14. The shifter circuit of claim 13, wherein said first transistor comprises a p-channel device.

15. The shifter circuit of claim 13, wherein said second transistor comprises an n-channel device.

16. The shifter circuit of claim 13, wherein said first transistor comprises a p-channel device, and said second transistor comprises an n-channel device.

17. The shifter circuit of claim 16, wherein said transistor stack comprises p-channel devices and n-channel devices, and wherein one of the p-channel devices is connected to the input signal.

18. The shifter circuit of claim 17, wherein the first of the input voltage divider stage's outputs is taken from an intermediate node between a p-channel and an n-channel device, and wherein the second of the input voltage divider stage's outputs is taken from an intermediate node between a pair of n-channel devices.

* * * * *

UNITED STATES PATENT AND TRADEMARK OFFICE
CERTIFICATE OF CORRECTION

| | | |
|---|---|---|
| PATENT NO. | : 7,061,298 B2 | Page 1 of 1 |
| APPLICATION NO. | : 10/920632 | |
| DATED | : June 13, 2006 | |
| INVENTOR(S) | : Erik J. Mentze et al. | |

It is certified that error appears in the above-identified patent and that said Letters Patent is hereby corrected as shown below:

Column 1, line 9, add the following paragraph:

GOVERNMENT SUPPORT

--This invention was funded in part by the NASA Idaho EPSCoR under contract NCC5-577. The United States Government has certain rights in the invention.--

Signed and Sealed this

Fourteenth Day of November, 2006

JON W. DUDAS
*Director of the United States Patent and Trademark Office*